United States Patent
Sanwo et al.

[11] Patent Number: 5,977,790
[45] Date of Patent: Nov. 2, 1999

[54] APPARATUS AND METHOD OF PROVIDING A PROGRAMMABLE SLEW RATE CONTROL OUTPUT DRIVER

[75] Inventors: Ikuo Jimmy Sanwo, San Marcos; Mahyar Nejat; Hiroshi Takano, both of San Diego, all of Calif.

[73] Assignees: Sony Corporation, Tokyo, Japan; Sony Electronics, Inc., Park Ridge, N.J.

[21] Appl. No.: 08/884,438

[22] Filed: Jun. 27, 1997

[51] Int. Cl.$^6$ .............................................. H03K 19/0185
[52] U.S. Cl. ................................ 326/27; 326/83; 326/87; 327/170
[58] Field of Search .................................. 326/83, 86–87, 326/17, 26–27, 57–58, 121; 327/170; 257/408

[56] References Cited

U.S. PATENT DOCUMENTS

| | | | |
|---|---|---|---|
| 4,232,327 | 11/1980 | Hsu | 257/408 |
| 4,680,487 | 7/1987 | Kobayashi | 326/17 |
| 4,731,553 | 3/1988 | Van Lehn et al. | 326/27 |
| 4,855,623 | 8/1989 | Flaherty | 326/87 |
| 5,122,690 | 6/1992 | Bianchi | 326/27 |
| 5,371,424 | 12/1994 | Quigley et al. | 326/121 |
| 5,387,824 | 2/1995 | Michelsen | 326/83 |
| 5,500,610 | 3/1996 | Burstein | 326/27 |

*Primary Examiner*—Jon Santamauro
*Attorney, Agent, or Firm*—Blakeky, Sokoloff, Taylor & Zafman LLP

[57] ABSTRACT

The present invention is a method and apparatus for providing slew rate control. The apparatus comprises a first circuit and a second circuit having an output terminal that is coupled to a first end of the first circuit. The second circuit receives a first input signal and a second input signal. The apparatus further comprises a third circuit having an output terminal that is coupled to the first end of the first circuit. The third circuit also receives the first input signal and the second input signal. The first circuit generates an output signal having a predetermined slew rate, where the output signal has a first state when the first and second input signals are in a first state.

17 Claims, 2 Drawing Sheets

| State | Data | Sel | Pad | Inv | Nand1 | Nand2 | Nor1 | Nor2 | M1 | M2 | M3 | M4 | M5 | M6 | M7 | M8 |
|---|---|---|---|---|---|---|---|---|---|---|---|---|---|---|---|---|
| 1 | H | H | H | L | H | L | L | L | OFF | OFF | ON | ON | ON | OFF | OFF | OFF |
| 2 | L | H | L | L | H | H | L | H | OFF | OFF | ON | ON | OFF | OFF | OFF | OFF |
| 3 | H | L | H | H | L | H | L | L | ON | OFF | OFF | OFF | OFF | OFF | ON | ON |
| 4 | L | L | L | H | H | H | H | L | OFF | ON | OFF | OFF | OFF | ON | ON | ON |

APPARATUS AND METHOD OF PROVIDING A PROGRAMMABLE SLEW RATE CONTROL OUTPUT DRIVER

BACKGROUND OF THE INVENTION

1. Field of the Invention

The present invention relates generally to integrated circuits (ICs), and more particularly, to a method and apparatus of providing a programmable slew rate control output driver for an IC.

2. Description of the Related Art

Typical integrated circuits (ICs) include a set of output drivers for driving signals provided by internal circuitry of the IC through output pads onto output transmission lines, which may be individual lines of an output bus. A typical output driver includes one or more transistors connected to a power supply and ground. Gates of the transistors are connected to internal lines providing the signals to be output.

Because output signals are often used as inputs to subsequent logic devices, the output signals must have sufficient voltage and current to drive the subsequent devices. A common practice is to buffer output signals by using transistors to ensure adequate output signal strength. However, providing each output signal with its own output buffer and driver, supplied by a power supply can create noise problems when many outputs switch state at once. For example, when several output buffers switch from one binary state to another, the output buffers and drivers tend to draw significant current (even CMOS buffer and drivers tend to draw current when the buffers switch states), which in turn tends to cause, through the inductance of the package of the IC, significant noise from the switching of signals on the output conductors of the package. Moreover, the reference voltages, such as $V_{cc}$ and $V_{ss}$, supplied on the IC tend to deviate from their normal voltage levels when many outputs switch state at once. These problems increase when the switching rate of operation for the buffers and drivers, or the number of buffers and drivers that are switching, increases; that is, when the frequency of the switching increases, more noise results and more deviations of $V_{cc}$ and $V_{ss}$ (from normal voltage levels) also results.

One current approach to these problems has involved the use of terminating or dumping resistors at the output of an IC. These dumping resistors are configured to reduce signal ringing problems. However, the addition of components to the IC reduces the signal quality and reliability. In addition, such terminating or dumping resistors are expensive to implement.

Accordingly, there is a need in the technology for an apparatus and method of providing a programmable slew rate control output driver for an IC to permit the designer or chip user to reduce noise, power consumption, or increase the speed of the IC, without sacrificing performance.

BRIEF SUMMARY OF THE INVENTION

The present invention is a method and apparatus for providing slew rate control. The apparatus comprises a first circuit and a second circuit having an output terminal that is coupled to a first end of the first circuit. The second circuit receives a first input signal and a second input signal. The apparatus further comprises a third circuit having an output terminal that is coupled to the first end of the first circuit. The third circuit also receives the first input signal and the second input signal. The first circuit generates an output signal having a predetermined slew rate, where the output signal has a first state when the first and second input signals are in a first state.

DETAILED DESCRIPTION OF THE INVENTION

Figure 1:
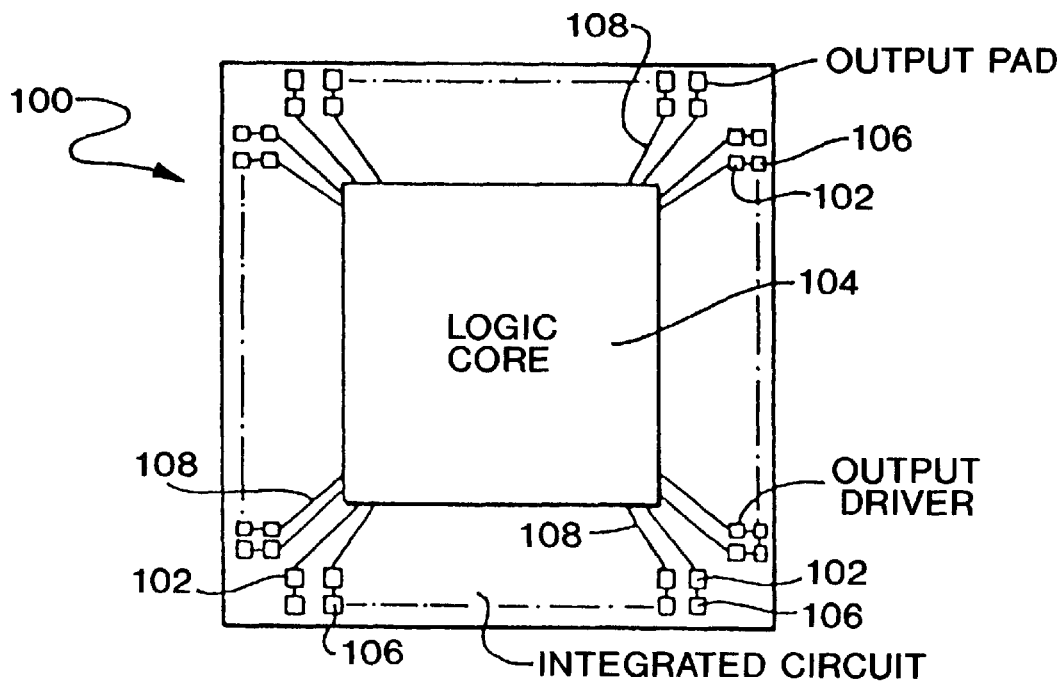
FIG. 1 is a block diagram illustrating an integrated circuit having output drivers configured in accordance with the principles of the present invention.

FIG. 1 is a block diagram illustrating an integrated circuit (IC) having output drivers configured in accordance with the principles of the present invention. As shown, the integrated circuit 100 has a set of output drivers 102 interconnecting a core logic unit 104 and a set of output pads 106. Each output driver 102 is connected along a separate output line 108 connecting the core logic unit to the respective output pad. Although not separately shown in FIG. 1, integrated circuit 100 may be counted within a package or other suitable module and interconnected to external components either directly or through a bus. Integrated circuit 100 may form part of a computer system or other system incorporating integrated circuits.

Figure 2:
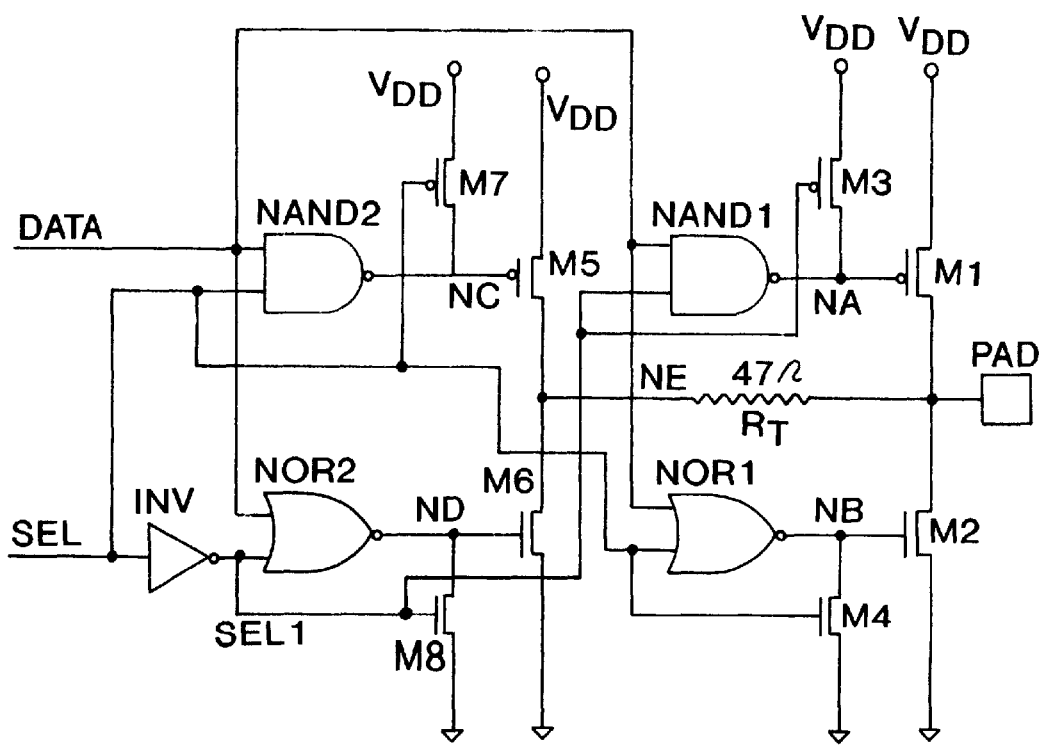
FIG. 2 is a circuit diagram of one of the output drivers of the integrated circuit of FIG. 1.

FIG. 2 is a circuit diagram of one of the programmable slew control output drivers 102 of the integrated circuit of FIG. 1. The output driver 102 comprises two NAND gates NAND1 and NAND2, two NOR gates NOR1 and NOR2, an inverter INV, and eight transistors M1–M8, of which M1, M3, M5 and M7 are PMOS transistors while M2, M4, M6 and M8 are NMOS transistors. Signals asserted on the DATA signal line are provided as one input to NAND2, NAND1 NOR2 and NOR2. Signals asserted on the SEL signal line are provided as an input to NAND2, the inverter INV NOR1, the gate of 14D and the gate of M7. The source of M7 is coupled to a constant voltage VDD, while its drain is coupled to the output of NAND2. The output of NAND2 is coupled to the gate of M5, while the source of M5 is coupled to VDD and its drain is coupled to the drain of M6. The inverter INV inverts the signal provided via SEL signal line, and provides an output signal as an input to NOR2, NAND1 and the gate of M3. NAND1 provides an output to the gate of M1, while NOR1 provides an output to the gate of M2. The sources of M3 and M1 are coupled to a voltage source, VDD, while the drain of M3 is coupled to the output of NAND1 and the drain of M1 is coupled to the output terminal PAD and the drain of M2. The drain of M5 is coupled to the drain of M6 and to one terminal of resistor RT. The other terminal of the resistor RT is coupled to the output terminal PAD. The sources of M2, M4, M6 and M8 are coupled to ground.

In one alternate embodiment, use of the resistor RT may be replaced by using a transistor, such as M5 or M6, which has extended diffusion. For example, the transistor M5 may be implemented with an extended diffusion drain. In this embodiment, the transistor M5 provides the resistance value of approximately 47 ohms. Alternately, the transistor M6 may be implemented with an extended diffusion drain. In this alternate embodiment, the transistor M6 provides the resistance value of approximately 47 ohms.

Figures 3, 4:
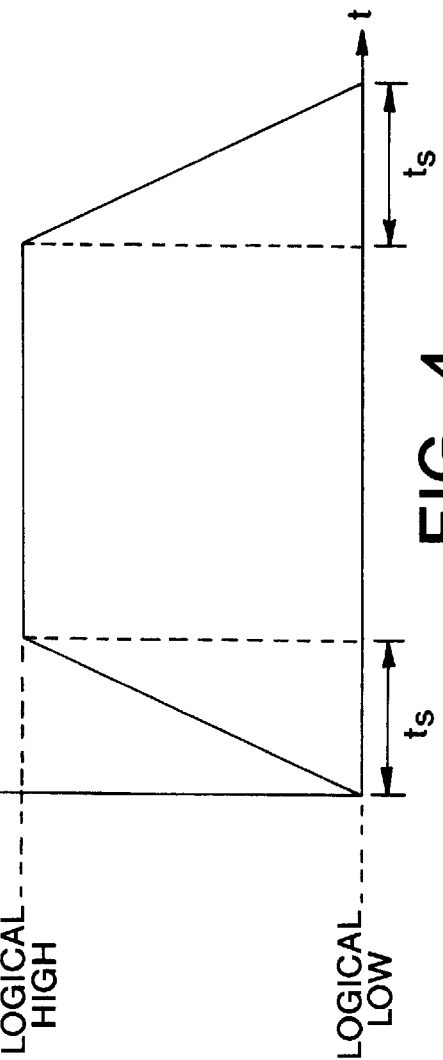
FIG. 3 is a table illustrating the logic states of the programmable slew control driver of the present invention.
FIG. 4 is a graph of a signal having a slew rate as provided in accordance with the principles of the present invention.

The output driver 102 operates in one of four logic states. The states of the components in the output driver 102 corresponding to each of these four states is shown in FIG. 3. In particular, when operating in states 1 and 2, the output driver 102 provides slew rate control and electro-static discharge (ESD) protection. When operating in states 3 and 4, the output driver 102 provides electro-static discharge (ESD) protection, with no slew rate control. The operation of output driver 102 in states 3 and 4 is provided in cases where slew rate control is not required, for example, where the load is non inductive (and thus no ringing effects in the output signal) or where a short connection from the integrated circuit 100 to an external component is required. Selection of slew rate control is provided by asserting a logical high signal via the SEL signal line of the output driver 102. Conversely, slew rate control is terminated by asserting a logical low signal via the SEL signal line. Data is provided via the DATA signal line in the output driver 102. The logical state of the signal asserted on the DATA signal line is duplicated at the output terminal, PAD, of the output driver 102.

With reference to FIGS. 2 and 3, operation of the output driver 102 will now be described in detail. The operation of the output driver 102 in states 1 and 2 (i.e., with slew rate control) will first be described. In particular, when a logical high signal is asserted on both the DATA signal line and the SEL signal line, the output driver 102 will be configured to operate in state 1. In this case, NAND2, NOR1 and NOR2 each generates a logical low signal, while NAND1 generates a logical high signal. In this case, M1, M2, M6, M7 and M8 are turned off, while M3, M4 and M5 are turned on. In particular, M3 and M4 become diode-connected, and current ID flows through M5 and resistor RT, to be output at the output terminal, PAD. As a result, the output at output terminal PAD transitions from a logical low to a logical high at a rate determined by the slew rate of the present invention, as shown in FIG. 4. The value of RT may be adjusted to control the slew rate of the output driver. In one embodiment, RT is equal to the characteristic impedance of a typical PCB, which is 47Ω. At a resistance value of 47Ω, the slew rate of provides the transition at a time interval $t_s$ of approximately 1–1½ ns.

In addition, by turning M1 and M2 off, the components in the output driver 102 as well as the IC 100 are protected from ESD generated by components that are external to the output driver 102. In particular, since M1 and M2 are turned off, other components in the output driver 102 and the IC 100 are isolated from any spurious signals that may be injected into the output driver 102 via the output terminal PAD.

When a logical low signal is asserted on the DATA signal line and a logical high signal is asserted on the SEL signal line, the output driver 102 will be configured to operate in state 2. In this case, NAND1, NAND2 AND NOR2 each generates a logical high signal, while NOR1 generates a logical low signal. M1, M2, M5, M7 and M8 are turned off, while M3, M4 and M6 are turned on. In particular, M3 and M4 become diode-connected, and current ID(M6) flows through M6 to ground. The current flow through RT will, at this point, be decreased at a slew rate as controlled by the value of RT. In particular, the output at PAD will transition from a logical high to a logical zero at a rate determined by the slew rate, as shown in FIG. 4. In the example shown in FIG. 4, the slew rate provides the transition at a time interval $t_s$ of approximately 1–1½ ns.

In addition, by turning M1 and M2 off, the components in the output driver 102 as well as the IC 100 are protected from ESD generated by components that are external to the output driver 102. The operation of the output driver 102 in states 3 and 4 (i.e., without slew rate control) will next be described. In particular, when a logical high signal is asserted on the DATA signal line and a logical low signal is asserted on the SEL signal line, the output driver 102 will be configured to operate in state 3. In this case, NAND1, NOR1 and NOR2 each generates a logical low signal, while NAND2 generates a logical high signal. In this case, M2, M3, M4, M5 and M6 are turned off, while M1, M7 and M8 are turned on. In particular, M7 and M8 become diode-connected, and current ID(M1) flows through M1 to be output at the output terminal, PAD. As a result, the output at PAD transitions from a logical low to a logical high. In addition, by turning M5 and M6 off, the components in the output driver 102 as well as the IC 100 are protected from ESD generated by components that are external to the output driver 102. In particular, since M5 and M6 are turned off, other components in the output driver 102 and the IC 100 are isolated from any spurious signals that may be injected into the output driver 102 via the output terminal PAD.

When a logical low signal is asserted on both the DATA signal line and the SEL signal line, the output driver 102 will be configured to operate in state 4. In this case, NAND1, NAND2 AND NOR1 each generates a logical high signal, while NOR2 generates a logical low signal. M1, M3, M4, M5, and M6 are turned off, while M2, M7 and M8 are turned on. In particular, M7 and M8 become diode-connected, and the current ID (M2) represented by the logical high signal that is generated by NOR1 flows through M2 to ground. As a result, the output at PAD transitions from a logical high to a logical low. In addition, by turning M5 and M6 off, the components in the output driver 102 as well as the IC 100 are protected from ESD generated by components that are external to the output driver 102.

The present invention thus provides an apparatus and method of providing a programmable slew rate control output driver for an IC. The slew rate control output driver permits the designer or chip user to reduce noise, power consumption, or increase the speed of the IC, without sacrificing performance.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. An apparatus for providing slew rate control, comprising:

a first circuit having a first end and a second end;

a second circuit having an output terminal that is coupled to the first end of the first circuit, said second circuit receives a first input signal and a second input signal;

a first device that is coupled to an output of said second circuit;

a third circuit having an output terminal that is coupled to the first end of the first circuit, said third circuit receives the first input signal and the second input signal; and a second device that is coupled to an output of said third circuit;

wherein the first circuit generates an output signal at the second end, having a first predetermined slew rate, said output signal having a first output state when said first and second input signals are in a first input state, and the first and second devices are inoperative when said second input signal is in the first input state and operative when said second input signal is in a second input state.

2. The apparatus of claim 1, wherein said output signal is in a second output state when said first input signal is in the second input state.

3. The apparatus of claim 1, wherein said first input state is a logical high state.

4. The apparatus of claim 2, wherein said second input state is a logical low state.

5. The apparatus of claim 1, wherein said first circuit is a resistor.

6. The apparatus of claim 1, wherein said first circuit is a PMOS transistor having a source, an extended diffusion drain and a gate, said gate of said transistor being coupled to said output terminal of said second circuit, said source of said transistor being coupled to a constant voltage, and said drain of said transistor providing said output signal having the first predetermined slew rate.

7. The apparatus of claim 1, wherein said first circuit is an NMOS transistor having a source, an extended diffusion drain and a gate, said gate of said transistor being coupled to said output terminal of said third circuit, said source of said transistor being coupled to ground, and said drain of said transistor being coupled to said output terminal of said second circuit, said drain providing said output signal having the first predetermined slew rate.

8. The apparatus of claim 1, further comprising:

a fourth circuit having an output terminal that is coupled to the second end of the first circuit, said fourth circuit receives the first input signal and a third input signal, said third input signal being the inverse of said second input signal;

a third device that is coupled to an output of said fourth circuit;

a fifth circuit having an output terminal that is coupled to the second end of the first circuit, said fifth circuit receives the first input signal and the second input signal;

a fourth device that is coupled to an output of said fifth circuit; and wherein said third and fourth devices are inoperative when said second input signal is in the second input state and operative when said second input signal is in the first input state.

9. The apparatus of claim 8, wherein said first circuit generates an output signal at the second end, having a second predetermined slew rate, said output signal having the first output state when said first input signal is in the first input state and said second input signal is in the second input state.

10. The apparatus of claim 9, further comprising said output signal having the second output state when said first and second input signals are in the second input state.

11. A method of providing slew rate control comprising:

providing a first circuit having a first end and a second end;

providing a second circuit having an output terminal that is coupled to the first end of the first circuit, said second circuit receives a first input signal and a second input signal;

providing a first device that is coupled to an output of said second circuit;

providing a third circuit having an output terminal that is coupled to the first end of the first circuit, said third circuit receives the first input signal and the second input signal;

providing a second device that is coupled to an output of said third circuit;

turning off said first and second devices when said second input signal is in a first input state;

turning on said first and second devices when said second input signal is in a second input state;

generating an output signal having a first predetermined slew rate, said output signal having a first output state when said first and second input signals are in the first input state.

12. The method of claim 11, wherein generating the output signal further comprises said output signal having a second output state when said first input signal is in the second input state.

13. The method of claim 11, wherein said first input state is a logical high state.

14. The method of claim 12, wherein said second input state is a logical low state.

15. The method of claim 11, further comprising:

providing a fourth circuit having an output terminal that is coupled to the second end of the first circuit, said fourth circuit receives the first input signal and a third input signal, said third input signal being the inverse of said second input signal;

providing a third device that is coupled to an output of said fourth circuit;

providing a fifth circuit having an output terminal that is coupled to the second end of the first circuit, said fifth circuit receives the first input signal and the second input signal;

providing a fourth device that is coupled to an output of said fifth circuit;

turning off said third and fourth devices when said second input signal is in the second input state; and turning on said third and fourth devices when said second input signal is in the first input state.

16. The method of claim 15, further comprising generating an output signal at the second end, having a second predetermined slew rate, said output signal having the first output state when said first input signal is in the first input state and said second input signal is in the second input state.

17. The method of claim 16, wherein generating said output signal having a second predetermined slew rate further comprises said output signal having a the second output state when said first and second input signals are in the second input state.

* * * * *